United States Patent [19]

Lee et al.

[11] Patent Number: 5,636,167

[45] Date of Patent: Jun. 3, 1997

[54] REDUNDANCY ROW/COLUMN PRETEST CIRCUITS

[75] Inventors: Ki Y. Lee; Hong S. Kim, both of Kyoungki-do, Rep. of Korea

[73] Assignee: Hyundai Electronics Industries Co., Ltd., Kyoungki-do, Rep. of Korea

[21] Appl. No.: 679,948

[22] Filed: Jul. 15, 1996

Related U.S. Application Data

[63] Continuation of Ser. No. 364,162, Dec. 27, 1994, abandoned.

[30] Foreign Application Priority Data

Dec. 28, 1993 [KR] Rep. of Korea ............ 93-30476

[51] Int. Cl.$^6$ ................................... G11C 29/00
[52] U.S. Cl. ............ 365/200; 365/230.06; 365/189.08
[58] Field of Search ........................... 365/200, 201, 365/189.08, 230.06; 371/10.1, 10.2

[56] References Cited

U.S. PATENT DOCUMENTS

| 4,860,260 | 8/1989 | Saito et al. | 365/200 |
|---|---|---|---|
| 4,996,670 | 2/1991 | Ciraula et al. | 365/200 |
| 5,377,146 | 12/1994 | Reddy et al. | 365/200 |
| 5,404,331 | 4/1995 | McClure | 365/201 |

*Primary Examiner*—Tan T. Nguyen
*Attorney, Agent, or Firm*—Morgan & Finnegan, L.L.P.

[57] ABSTRACT

Disclosed are redundancy row/column pretest circuits for a semiconductor memory device. Each of the redundancy row/column pretest circuits comprises a redundancy test pad for supplying a redundancy test signal, and a circuit for generating a normal row or column disable signal in response to the redundancy test signal from the redundancy test pad to disable a normal operation and perform a redundancy operation. Therefore, redundancy row/column cells are operated even under the condition that a redundancy circuit is not programmed, so that faults of the redundancy row/column cells can be tested in the same manner as those of normal cells.

3 Claims, 4 Drawing Sheets

REDUNDANCY ROW/COLUMN PRETEST CIRCUITS

This is a continuation of application Ser. No. 08/364,162, filed on Dec. 27, 1994, abandoned.

BACKGROUND OF THE INVENTION

1. Field of the Invention

The present invention relates in general to redundancy row/column pretest circuits for a semiconductor memory device, and more particularly, to a pretest circuit for pretesting operating states of redundancy row/column cells of the semiconductor memory device using a redundancy test signal inputted through an additional redundancy test pad, to check faults thereof.

2. Description of the Prior Art

In a conventional repairing method, a normal operation test is performed at a wafer state to find faulty cells. If the faulty cells are found, they are substituted with redundancy row/column cells by redundancy row/column circuits. As a result, a die is obtained in which the faulty cells are repaired.

However, the above-mentioned conventional repairing method has a disadvantage in that faults may occur in the repaired cells because the redundancy row/column cells have a similar fault probability to that of normal cells. Also, because the faulty cells are repaired after the normal operation test, when the faults occur in the repaired cells, a laser repair operation and the accompanying test operation must be performed, resulting in unnecessary time consumption.

SUMMARY OF THE INVENTION

Therefore, the present invention has been made in view of the above problem, and it is an object of the present invention to provide redundancy row/column pretest circuits for a semiconductor memory device which are capable of testing operating states of redundancy row/column cells in a normal row/column operation test to discriminate a repairable die.

In accordance with one aspect of the present invention, there is provided a redundancy row pretest circuit for a semiconductor memory device, comprising a redundancy test pad for supplying a redundancy test signal; and means for generating a normal row disable signal in response to the redundancy test signal from said redundancy test pad to disable a normal operation and perform a redundancy operation, whereby redundancy rows are operated even under the condition that a redundancy circuit is not programmed, so that faults of the redundancy rows can be tested in the same manner as those of normal cells.

In accordance with another aspect of the present invention, there is provided a redundancy column pretest circuit for a semiconductor memory device, comprising a redundancy test pad for supplying a redundancy test signal; and means for generating a normal column disable signal in response to the redundancy test signal from said redundancy test pad to disable a normal operation and perform a redundancy operation; whereby redundancy column cells are operated even under the condition that a redundancy circuit is not programmed, so that faults of the redundancy column cells can be tested in the same manner as those of normal cells.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
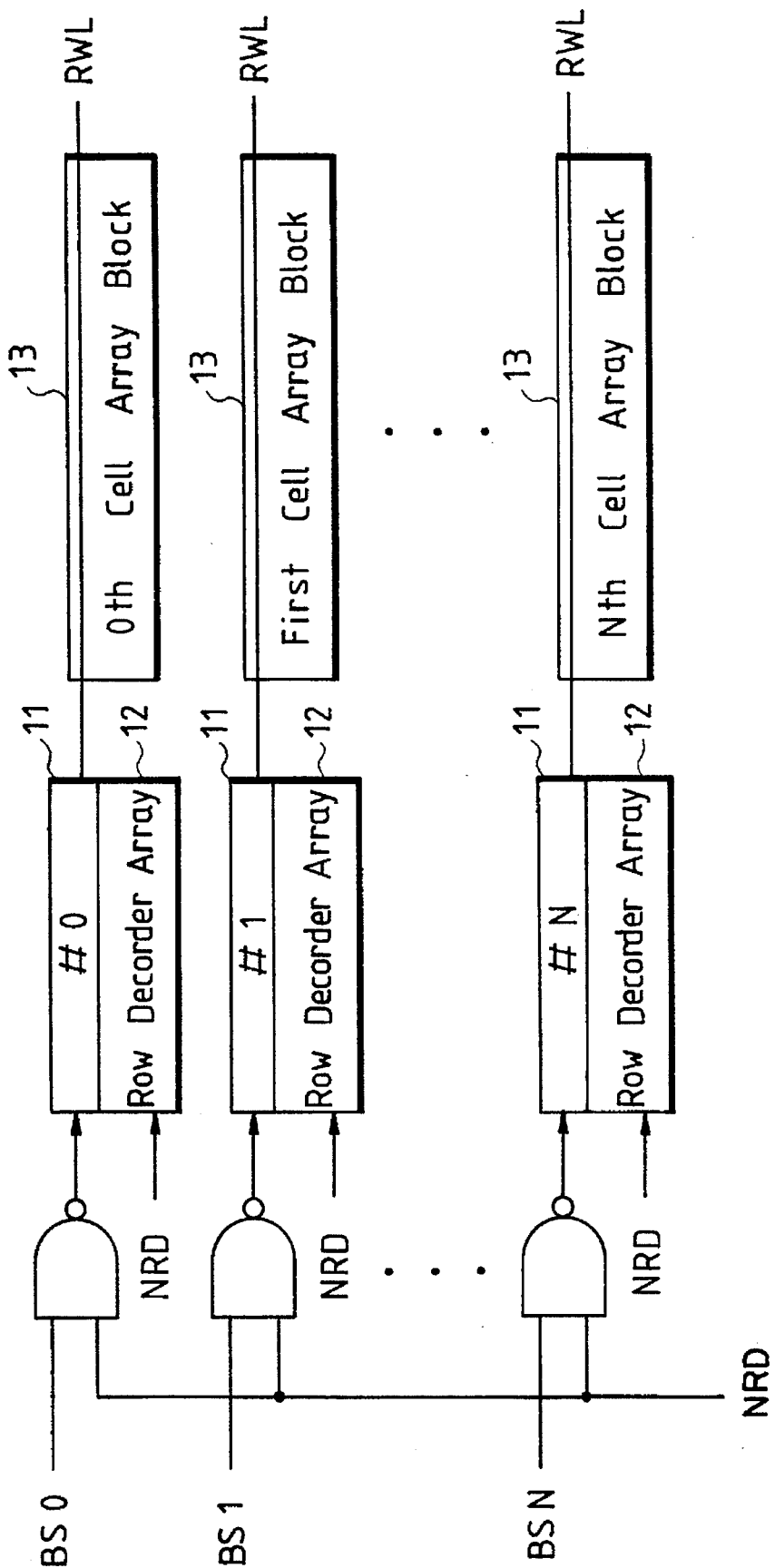
FIG. 1 is a schematic view illustrating a construction of a redundancy row pretest circuit in accordance with the present invention.

Referring to FIG. 1, there is shown a schematic view illustrating a construction of a redundancy row pretest circuit in accordance with the present invention. As shown in this drawing, the redundancy row pretest circuit comprises row decoder arrays 12 being disabled in response to a normal row disable signal NRD when a faulty cell repair operation is performed, and redundancy row drivers 11 being enabled in response to the normal row disable signal NRD and cell array block select signals BS when the faulty cell repair operation is performed. The normal row disable signal NRD is generated to disable a normal operation. When the faulty cell repair operation is performed, the normal row disable signal NRD goes high in logic, thereby causing the row decoder arrays 12 to be disabled. On the contrary, in the case where a selected one of the cell array block select signals BS goes high in logic under the condition that the normal row disable signal NRD goes high in logic, the corresponding redundancy row driver 11 is enabled, so as to enable a redundancy word line RWL of a corresponding cell array block 13. As a result, data is read or written from or into cells connected to the enabled redundancy word line RWL of the cell array block 13.

Figure 2:
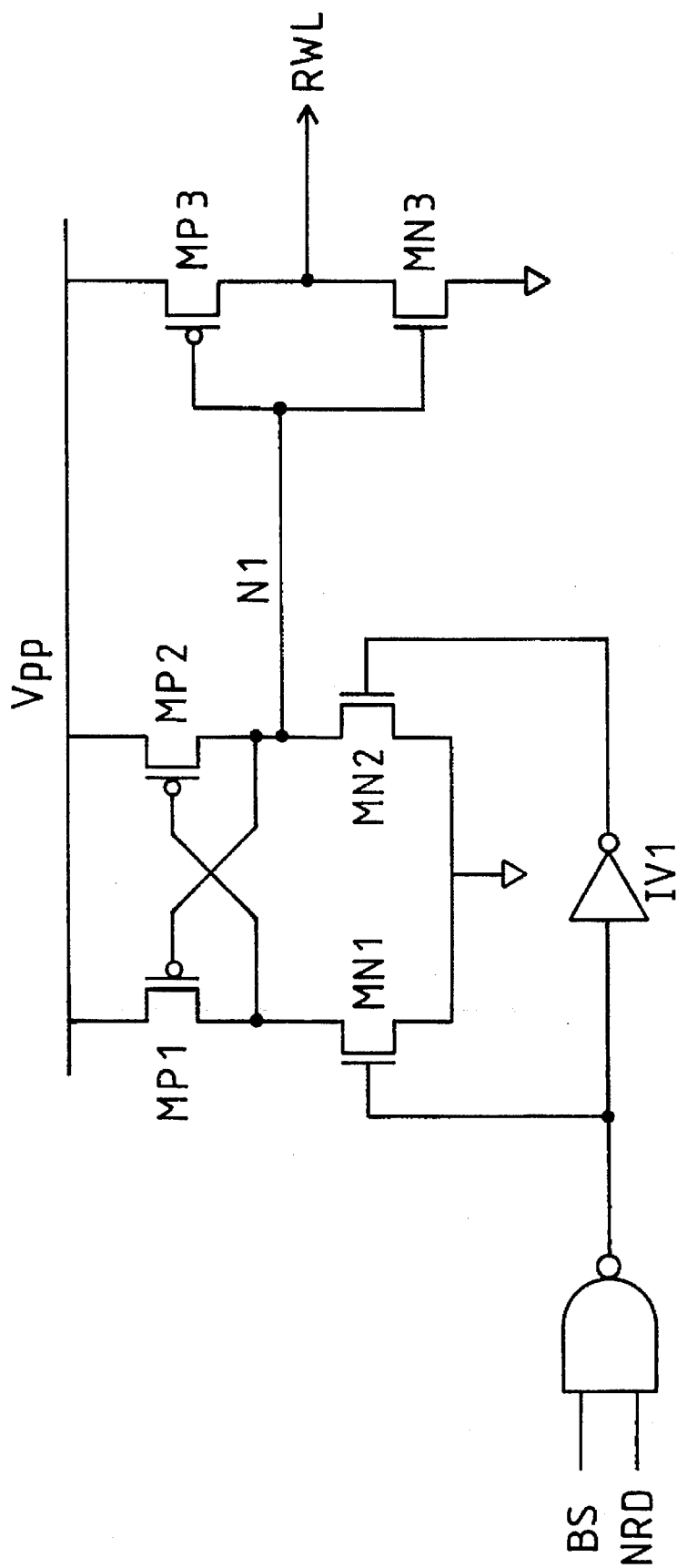
FIG. 2 is a detailed circuit diagram of a redundancy row driver in FIG. 1.

Referring to FIG. 2, there is shown a detailed circuit diagram of each of the redundancy row drivers 11 in FIG. 1. As shown in this drawing, the redundancy row driver 11 includes three PMOS transistors MP1–PM3, three NMOS transistor MN1–MN3 and an inverter IV1. The inveter having an input and an ouput. The first NMOS transistor MN1, having a drain and a source, wherein its gate is connected to the input of said inveter IV1. The second NMOS transistor MN2 having a gate connected to the output of said inverter IV1, and a source connected to the source of said first NMOS transistor MN1. The pair of cross-coupled PMOS transistors MP1, MP2 having their drains connected to the drains of the first and second NMOS transistors MN1, MN2. The third NMOS transistor MN3 having its gate connected the drain of the second NMOS transistor MN2 and the drain of one of the pair of cross-coupled PMOS transistors MP1, MP2. The third PMOS transistor MP3 having its gate connected to the drain of the second NMOS transistor MN2, the drain of the one of the pair of cross-coupled PMOS transistors MP1, MP2, and the gate of the third NMOS transistor MN3. When both the cell array block select signal BS and the normal row disable signal NRD are high in logic, the NMOS transistor MN1 is turned off, whereas the NMOS transistor MN2 is turned on, thereby causing a voltage at a node N1 to become low in logic. As a result, at a driver stage, the PMOS transistor MP3 is turned on, whereas the NMOS transistor MN3 is turned off, so as to enable the redundancy word line RWL of the cell array block 13.

As stated previously with reference to FIGS. 1 and 2, in order to enable the redundancy word line RWL of the cell array block 13, the normal row disable signal NRD must go high in logic.

Therefore, in accordance with the present invention, the redundancy row pretest circuit comprises a redundancy test pad provided in the outside of a semiconductor memory device, for supplying a redundancy test signal RT, and a circuit for generating the normal row disable signal NRD in response to the redundancy test signal RT from the redundancy test pad. When the redundancy test signal RT from the redundancy test pad goes high in logic, the normal row disable signal NRD becomes high in logic. Under this condition, when the cell array block select signal BS goes high in logic as it is selected by a row address, the redundancy row driver 11 is enabled, so as to enable the redundancy word line RWL of the cell array block 13. As a result, faults of redundancy row cells can be checked in the same manner as those of normal cells.

Figure 3:
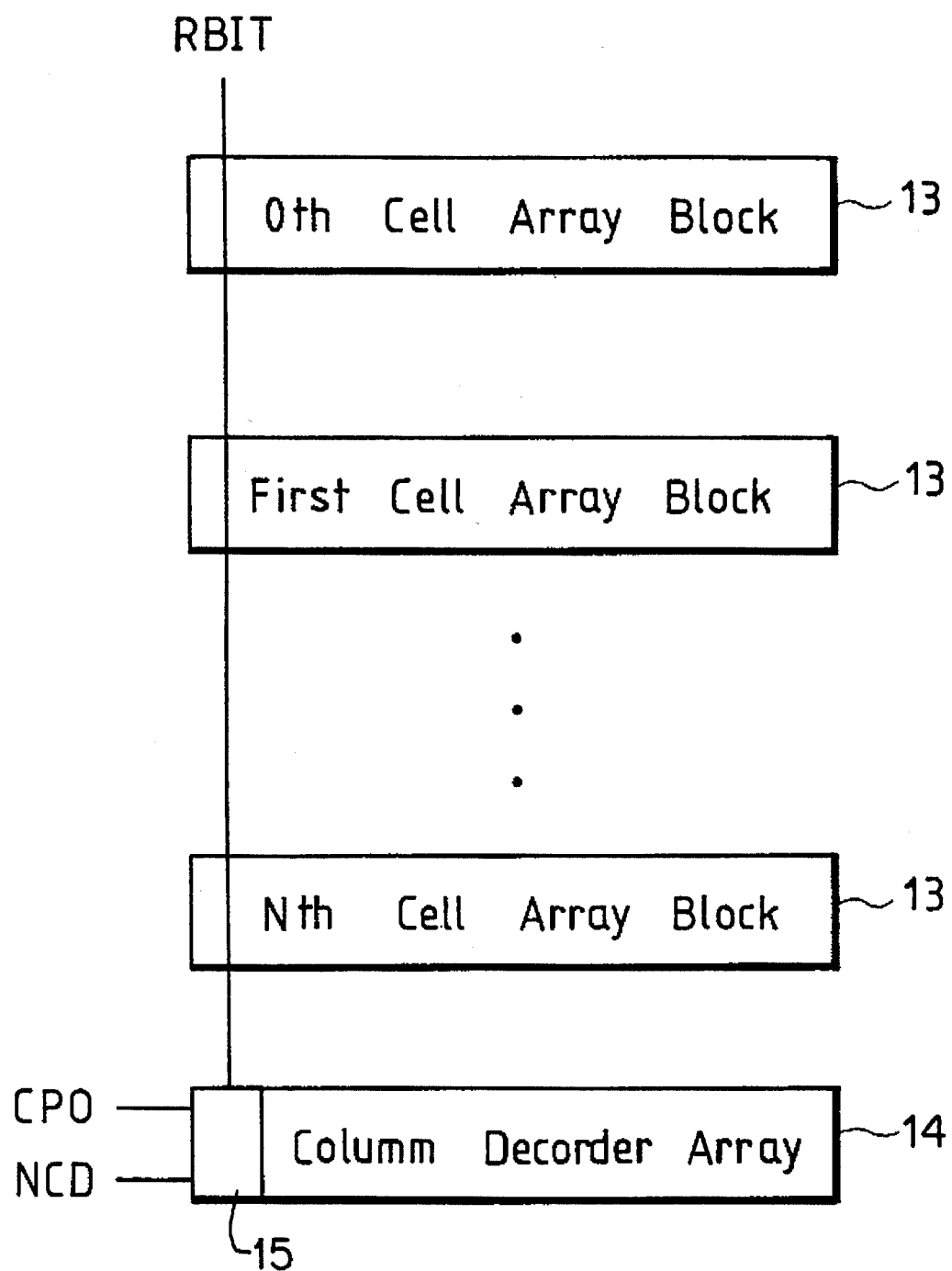
FIG. 3 is a schematic view illustrating a construction of a redundancy column pretest circuit in accordance with the present invention.

Referring to FIG. 3, there is shown a schematic view illustrating a construction of a redundancy column pretest circuit in accordance with the present invention. As shown in this drawing, the redundancy column pretest circuit comprises a column decoder array 14 being disabled in response to a normal column disable signal NCD when the faulty cell repair operation is performed, and a redundancy column decoder 15 being enabled in response to the normal column disable signal NCD and a column predecoder output signal CPO when the faulty cell repair operation is performed. The normal column disable signal NCD is generated to disable the normal operation. When the faulty cell repair operation is performed, the normal column disable signal NCD goes high in logic, thereby causing the column decoder array 14 to be disabled. On the contrary, in the case where the column predecoder output signal CPO goes high in logic under the condition that the normal column disable signal NCD goes high in logic, the redundancy column decoder 15 is operated, so as to enable a redundancy bit line RBIT of the cell array block 13. As a result, data is read or written from or into cells connected to the enabled redundancy bit line RBIT of the cell array block 13.

Figure 4:
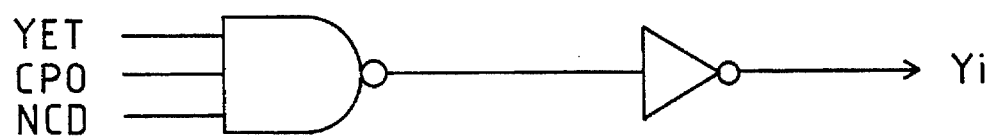
FIG. 4 is a detailed circuit diagram of a redundancy column decoder in FIG. 3.

Referring to FIG. 4, there is shown a detailed circuit diagram of the redundancy column decoder 15 in FIG. 3. As shown in this drawing, the redundancy column decoder 15 includes a NAND gate for NANDing a column enable signal YET, the normal column disable signal NCD and the column predecoder output signal CPO, and an inverter for inverting an output signal from the NAND gate and outputting the resultant signal Yi to the redundancy bit line RBIT of the cell array block 13. When the faulty cell repair operation is performed, the normal column disable signal NCD, the column predecoder output signal CPO and the column enable signal YET all become high in logic. As a result, the output signal Yi goes high in logic, thereby causing the redundancy bit line RBIT of the cell array block 13 to be enabled.

As stated previously with reference to FIGS. 3 and 4, in order to enable the redundancy bit line RBIT of the cell array block 13, the normal column disable signal NCD must go high in logic.

Therefore, in accordance with the present invention, the redundancy column pretest circuit comprises the redundancy test pad provided in the outside of the semiconductor memory device, for supplying the redundancy test signal RT, similarly to the redundancy row pretest circuit in FIG. 1. Also, the redundancy column pretest circuit comprises a circuit for generating the normal column disable signal NCD in response to the redundancy test signal RT from the redundancy test pad. When the redundancy test signal RT from the redundancy test pad goes high in logic, the normal column disable signal NCD becomes high in logic. Under this condition, when both the column predecoder output signal CPO and the column enable signal YET become high in logic as they are selected by a column address, the redundancy column decoder 15 is enabled, so as to enable the redundancy bit line RBIT of the cell array block 13. As a result, faults of redundancy column cells can be checked in the same manner as those of normal cells.

Figure 5:
FIG. 5 is a detailed circuit diagram of circuits for generating normal row and column disable signals in FIGS. 1 to 4.

Referring to FIG. 5, there is shown a detailed circuit diagram of each of the circuits for generating the normal row and column disable signals NRD and NCD in FIGS. 1 to 4. As shown in this drawing, the circuits for generating the normal row and column disable signals NRD and NCD have the same construction. The normal row/column disable signal generation circuit includes a NOR gate for NORing the redundancy test signal RT from the redundancy test pad and an external signal RFA/CFA, and an inverter for inverting an output signal from the NOR gate and outputting the resultant signal as the normal row/column disable signal NRD/NCD. In result, the normal row/column disable signal generation circuit is controlled by the redundancy test signal RT from the redundancy test pad. The use of the redundancy test signal RT from the redundancy test pad makes it possible to perform the redundancy operation even under the condition that the redundancy circuit is not programmed as in the normal operation test. Therefore, even in this case, the faults of the redundancy row and column cells can be checked.

Noticeably, the redundancy test signal RT from the redundancy test pad becomes high in logic only when the test operation is performed. In this connection, the redundancy test signal RT from the redundancy test pad has no effect on the normal operation or the redundancy operation.

As apparent from the above description, according to the present invention, the pretest circuit can pretest the faults of the redundancy row/column cells of the semiconductor memory device to substitute a faulty cell with a normal redundancy cell. Also, the pretest circuit of the present invention can prevent a fault from occurring in the repaired cell because of a fault of the redundancy cell, resulting in an increase in the repairing efficiency. Furthermore, the pretest circuit of the present invention tests the operating states of the redundancy row/column cells in the normal row/column operation test to discriminate the repairable die. Therefore, the pretest circuit of the present invention has the effect of reducing the time required in a laser repair operation and the accompanying test operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A redundancy row pretest circuit for a semiconductor memory device having a main memory portion and a redundant memory portion, comprising:

a redundancy test contact for supplying a redundancy test signal; a redundancy row driver comprising:

an inverter having an input and an ouput;

a first NMOS transistor, having a drain and a source, wherein its gate is connected to the input of said inveter;

a second NMOS transistor having a gate connected to the output of said inverter, and a source connected to the source of said first NMOS transistor;

a pair of cross-coupled PMOS transistors having their drains connected to the drains of said first and second NMOS transistors;

a third NMOS transistor having its gate connected the drain of said second NMOS transistor and the drain of one of said pair of cross-coupled PMOS transistors; and a third PMOS transistor having its gate connected to the drain of said second NMOS transistor, the drain of said one of said pair of cross-coupled PMOS transistors, and the gate of said third NMOS transistor; and means for generating a normal row disable signal in response to the redundancy test signal from said redundancy test contact to disable a row in said main memory portion and activate a row in said redundant memory portion using said redundancy row driver, wherein said row in said redundant memory portion is tested even if no error was previously found in said main memory portion.

2. A redundancy column pretest circuit for a semiconductor memory device having a main memory portion and a redundant memory portion, comprising:

a redundancy test contact for supplying a redundancy test signal;

a redundancy column decoder comprising:

an inveter having an input and an ouput;

a first NMOS transistor, having a drain and a source, wherein its gate is connected to the input of said inveter;

a second NMOS transistor having a gate connected to the output of said inverter, and a source connected to the source of said first NMOS transistor;

a pair of cross-coupled PMOS transistors having their drains connected to the drains of said first and second NMOS transistors;

a third NMOS transistor having its gate connected the drain of said second NMOS transistor and the drain of one of said pair of cross-coupled PMOS transistors; and a third PMOS transistor having its gate connected to the drain of said second NMOS transistor, the drain of said one of said pair of cross-coupled PMOS transistors, and the gate of said third NMOS transistor; and means for generating a normal column disable signal in response to the redundancy test signal from said redundancy test contact to disable a column in said main memory portion and activate a column in said redundant memory portion using said redundancy column decoder, wherein said column in said redundant memory portion is tested even if no error was previously found in said main memory portion.

3. A redundancy pretest circuit for a semiconductor memory device having a main memory portion and a redundant memory portion, comprising:

a redundancy test contact for supplying a redundancy test signal;

a redundancy driver comprising:

an inveter having an input and an ouput;

a first NMOS transistor, having a drain and a source, wherein its gate is connected to the input of said inveter;

a second NMOS transistor having a gate connected to the output of said inverter, and a source connected to the source of said first NMOS transistor;

a pair of cross-coupled PMOS transistors having their drains connected to the drains of said first and second NMOS transistors;

a third NMOS transistor having its gate connected the drain of said second NMOS transistor and the drain of one of said pair of cross-coupled PMOS transistors; and a third PMOS transistor having its gate connected to the drain of said second NMOS transistor, the drain of said one of said pair of cross-coupled PMOS transistors, and the gate of said third NMOS transistor; and means for generating a normal disable signal in response to the redundancy test signal from said redundancy test contact to disable a section of said main memory portion and activate a section in said redundant memory portion using said redundancy driver, wherein said section in said redundant memory portion is tested even if no error was previously found in said main memory portion.

* * * * *